(12) United States Patent
Hong et al.

(10) Patent No.: US 6,734,061 B2
(45) Date of Patent: May 11, 2004

(54) SEMICONDUCTOR MEMORY DEVICE HAVING A PLUG CONTACTED TO A CAPACITOR ELECTRODE AND METHOD FOR FABRICATING THE CAPACITOR

(75) Inventors: Kwon Hong, Ichon-shi (KR); Hyung-Bok Choi, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 33 days.

(21) Appl. No.: 09/888,060

(22) Filed: Jun. 25, 2001

(65) Prior Publication Data
US 2002/0013027 A1 Jan. 31, 2002

(30) Foreign Application Priority Data
Jun. 30, 2000 (KR) .......................... 2000-37007

(51) Int. Cl.$^7$ ...................... H01L 21/8242; H01L 29/76
(52) U.S. Cl. ...................... 438/253; 438/256; 438/396; 438/399; 438/652; 438/653; 257/306; 257/311; 257/296
(58) Field of Search ................ 438/256, 396, 438/399, 652, 653, 239, 657, 689, 722, 253, 270, 675, 243, 392, 650, 240; 257/306, 311, 296

(56) References Cited

U.S. PATENT DOCUMENTS

| | | | |
|---|---|---|---|
| 5,877,062 A | | 3/1999 | Horii |
| 5,892,254 A | | 4/1999 | Park et al. |
| 6,255,187 B1 | * | 7/2001 | Horii .......................... 438/396 |
| 6,297,155 B1 | * | 10/2001 | Simpson et al. ............ 438/687 |
| 2002/0030210 A1 | * | 3/2002 | Matsui et al. ................ 257/296 |

FOREIGN PATENT DOCUMENTS

| | | | | |
|---|---|---|---|---|
| EP | 0847083 A2 | 8/1997 | ....... | H01L/21/3205 |
| EP | 0847083 A3 | 8/1997 | ....... | H01L/21/3205 |
| TW | 425711 | 3/2001 | ......... | H01L/27/108 |

* cited by examiner

Primary Examiner—Matthew S. Smith
Assistant Examiner—Igwe U. Anya
(74) Attorney, Agent, or Firm—Jacobson Holman PLLC

(57) ABSTRACT

The present invention provides a semiconductor memory device and a fabrication method capable of preventing the contact between a dielectric layer of a capacitor and a diffusion barrier. The plug comprises a diffusion barrier layer and a seed layer for forming a lower electrode of a capacitor. Accordingly, it is possible to prevent the dielectric layer being contacted with the diffusion barrier, whereby the leakage current may be reduced, and the capacitance of the capacitor may be increased.

18 Claims, 10 Drawing Sheets

SEMICONDUCTOR MEMORY DEVICE HAVING A PLUG CONTACTED TO A CAPACITOR ELECTRODE AND METHOD FOR FABRICATING THE CAPACITOR

FIELD OF THE INVENTION

The present invention relates to a method for fabricating a semiconductor memory device; and more particularly, to a method for fabricating a capacitor of a semiconductor memory device.

DESCRIPTION OF THE PRIOR ART

A DRAM (Dynamic Random Access Memory) cell is a semiconductor memory device typically comprising one transistor and one capacitor, in which one bit of data is stored in a cell by using an electric charge. A capacitor comprises of a lower electrode, a dielectric layer, and an upper electrode. One electrode of the capacitor is connected to the source/drain junction of the transistor. Another electrode of the capacitor is connected to a reference voltage line.

Advances in computer applications have increased the demand for higher capacity memory chips. Decreasing the size of the memory cells allows more memory cells to be packed into an integrated circuit.

The capacitance of a capacitor is proportional to the surface area of the electrodes and a dielectric constant of a dielectric layer. As the area of the memory cell has decreased, the capacitance of the capacitors tends to decrease also, lowering the performance of the memory cells.

In order to increase the density of memory cells, stacked capacitors have been proposed. Stacked capacitors are formed by partially stacking the storage electrode over the transistor and over the bit/word line, thereby effectively reducing the area used for each memory cell.

A plug is used to connect the lower electrode of the capacitor with the source/drain junction of the transistor.

A method for fabricating a capacitor of a semiconductor memory device according to a first conventional method is described referring to FIG. 1A to FIG. 1C.

As shown in FIG. 1A, an insulating layer 15 is formed over a semiconductor substrate 10, an isolation layer 11, such as field oxide layer, and a transistor comprising a gate insulating layer 12, a gate electrode 13 and source/drain junctions 14. Thereafter, a plug 16 is formed in the insulating layer 15. The plug 16 is composed of a ploysilicon layer 16A, an ohmic contact layer 16B and a diffusion barrier layer 16C formed in a contact hole, exposing one of the source/drain junctions 14.

As shown in FIG. 1B, a lower electrode 17 is formed on the diffusion barrier layer 16C by depositing and patterning a first conductive layer. The diffusion barrier layer 16C may be exposed during the formation of the lower electrode 17 because of a mask misalignment. The mask misalignment is frequently occurred in a manufacturing process of a highly integrated device.

As shown in FIG. 1C, a dielectric layer 18 is formed on the lower electrode 17 and an upper electrode 19 is formed on the dielectric layer 18. The dielectric layer 18 is formed with a material exhibiting a very high dielectric constant, such as Barium strontium titanate ($BaSrTiO_3$, hereafter abbreviated BST), to increase the capacitance in a highly integrated device.

An electro plating technique is used to form the lower electrode without etching process.

A method for fabricating a capacitor of a semiconductor memory device according to a second conventional method, by using the electro plating technique, is described referring to FIG. 2A to FIG. 2E.

As shown in FIG. 2A, an insulating layer 15 is formed over a semiconductor substrate 10, an isolation layer 11, such as field oxide layer, and a transistor comprising a gate insulating layer 12, a gate electrode 13 and source/drain junctions 14. Thereafter, a plug 16 is formed in the insulating layer. The plug 16 is composed of a ploysilicon layer 16A, an ohmic contact layer 16B and a diffusion barrier layer 16C formed in a contact hole, exposing one of the source/drain junctions 14.

As shown in FIG. 2B, a seed layer 21 is formed on the insulating layer 15 and the plug 16, thereafter a glue layer 22 and a sacrificial layer 23 are stacked, one by one, on the seed layer 21.

As shown in FIG. 2C, the sacrificial layer 23 and the glue layer 22 is selectively etched to form opening exposing the seed layer 21, and a lower electrode 17 is formed on the seed layer 21 in the opening.

As shown FIG. 2D, the sacrificial layer 23, the glue layer 22 and the seed layer 21 are removed to separate neighboring the lower electrodes 17.

As shown in FIG. 2E, a dielectric layer 18 is deposited on the lower electrode 17 and the insulating layer 15. Thereafter, an upper electrode 19 is formed on the dielectric layer 18.

In the preceding process of the second conventional method, the diffusion barrier layer 16C of the plug 16 may be exposed after removing the seed layer when the mask misalignment is occurred in the process for forming the opening.

According to the above described conventional methods, the exposed part of the diffusion barrier layer 16C of the plug 16 is contacted to the dielectric layer 18.

There are several problems generated by the contact between the diffusion layer 16C and the dielectric layer 18. One problem is that the diffusion barrier layer 16C is oxidized during the process for forming the dielectric layer 18, because the dielectric layer 18, such as the BST layer, is formed under oxygen gas atmosphere and at a high temperature. The oxidized part of the diffusion barrier layer 16C, exhibiting low dielectric constant, plays a role of a dielectric layer of a capacitor, thereby the capacitance of the capacitor is reduced. The other problem is that the work function difference, between the diffusion barrier 16C and the dielectric layer 18, is low, thereby the leakage current is increased because of the low Schottky barrier height.

SUMMARY OF THE INVENTION

It is, therefore, an object of the present invention to provide a semiconductor memory device and a fabrication method capable of preventing the contact between a dielectric layer of a capacitor and a diffusion barrier of a plug.

It is, therefore, another object of the present invention to provide a semiconductor memory device and a fabrication method capable of preventing the lowering the capacitance of a capacitor and the increasing the leakage current between the lower electrode of a capacitor and a diffusion barrier of a plug.

In accordance with an aspect of the present invention, there is provided a semiconductor memory device, comprising: a semiconductor substrate, wherein a gate electrode is formed on the semiconductor substrate, and wherein source/drain junctions are formed in the semiconductor substrate; an interlayer insulating layer formed over the semiconductor substrate; a plug formed in the interlayer insulating layer, wherein the plug comprises a diffusion barrier layer and a seed layer for a electro plating; a lower electrode of capacitor contacted to the seed layer; a dielectric layer formed on the lower electrode; and an upper electrode formed on the dielectric layer.

In accordance with another aspect of the present invention, there is provided a method for fabricating semiconductor memory device, comprising the steps of: providing a semiconductor substrate, wherein a gate electrode is formed on the semiconductor substrate, and wherein source/drain junctions are formed in the semiconductor substrate; forming an interlayer insulating layer over the semiconductor substrate; etching the interlayer insulating layer to form a contact hole; forming a plug in the contact hole, wherein the plug comprises a diffusion barrier layer and a seed layer for a electro plating; forming a lower electrode of a capacitor contacted to the seed layer by using an electro plating technique; forming a dielectric layer of the capacitor on the lower electrode; and forming an upper electrode of the capacitor on the dielectric layer.

In accordance with still further another aspect of the present invention, there is a method for fabricating semiconductor memory device, comprising the steps of: providing a semiconductor substrate, wherein a gate electrode is formed on the semiconductor substrate, and wherein source/drain junctions are formed in the semiconductor substrate; forming an interlayer insulating layer over the semiconductor substrate; etching the interlayer insulating layer to form a contact hole; forming a plug in the contact hole, wherein the plug comprises a diffusion barrier layer and a seed layer for a electro plating; forming a glue layer on the seed layer and the interlayer insulating layer; forming a sacrificial layer on glue layer; etching the sacrificial layer and the glue layer to form an opening defining a region of a lower electrode of a capacitor; forming the lower electrode on the seed layer in the opening, by using an electro plating technique; removing the sacrificial layer and the glue layer; forming a dielectric layer of the capacitor on the lower electrode; and forming an upper electrode of the capacitor on the dielectric layer.

BRIEF DESCRIPTION OF THE DRAWINGS

The above and other objects and features of the present invention will become apparent from the following description of the preferred embodiments given in conjunction with the accompanying drawings, in which:

FIG. 3A to FIG. 3I are cross sectional views showing a method for fabricating a capacitor of a semiconductor device according to an embodiment of the present invention.

DETAILED DESCRIPTION OF THE PREFERRED EMBODIMENTS

Hereinafter, a semiconductor memory device fabrication method according to embodiments of the present invention will be described in detail referring to the accompanying drawings.

Figure 1A:
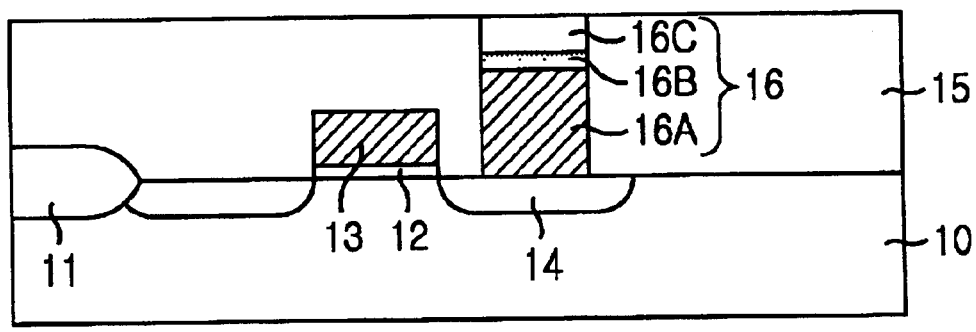
FIG. 1A to FIG. 1C are cross sectional views showing a method for fabricating a semiconductor memory device according to a first conventional method.
Figure 1B:
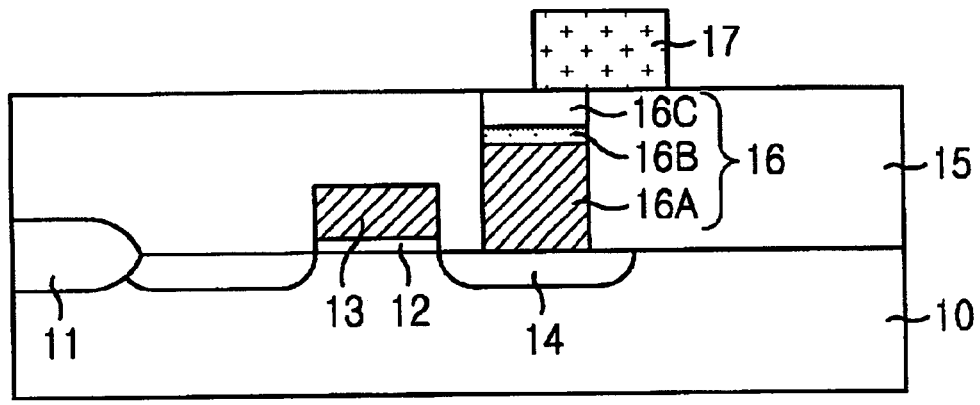
Figure 1C:
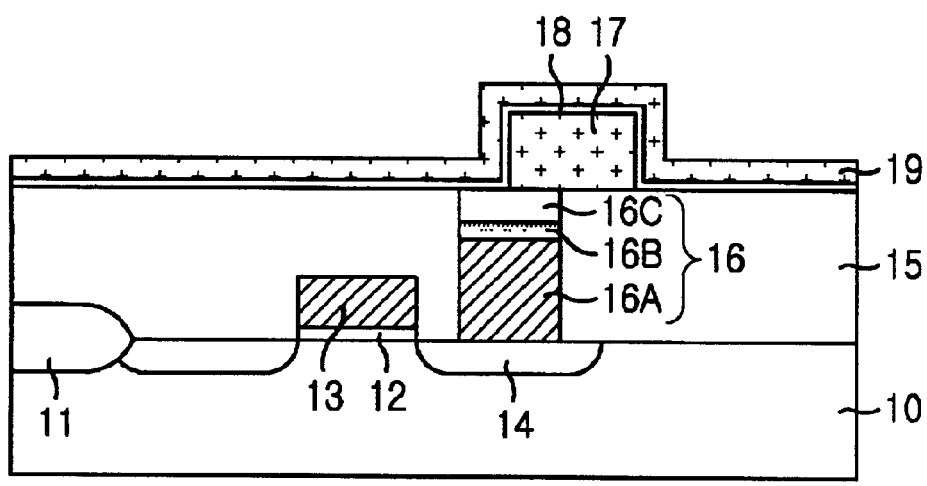
Figure 2A:
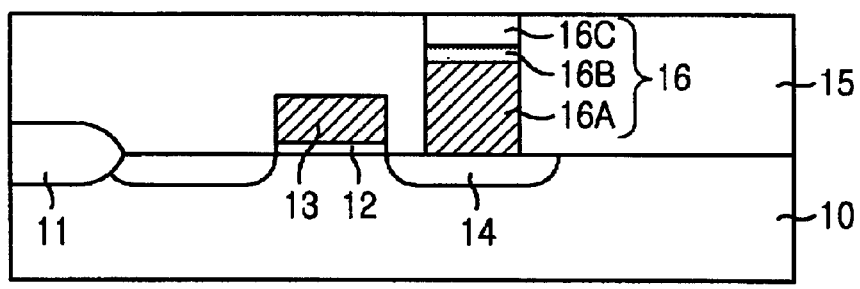
FIG. 2A to FIG. 2E are cross sectional views showing a method for fabricating a semiconductor memory device according to a second conventional method.
Figure 2B:
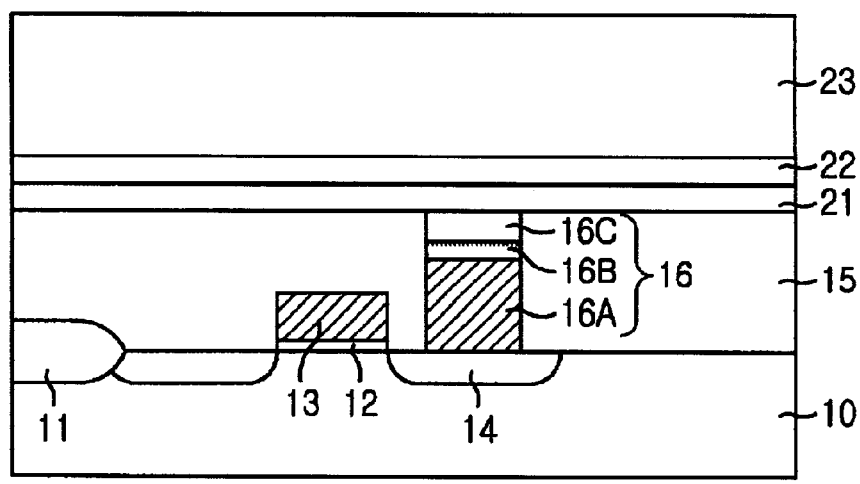
Figure 2C:
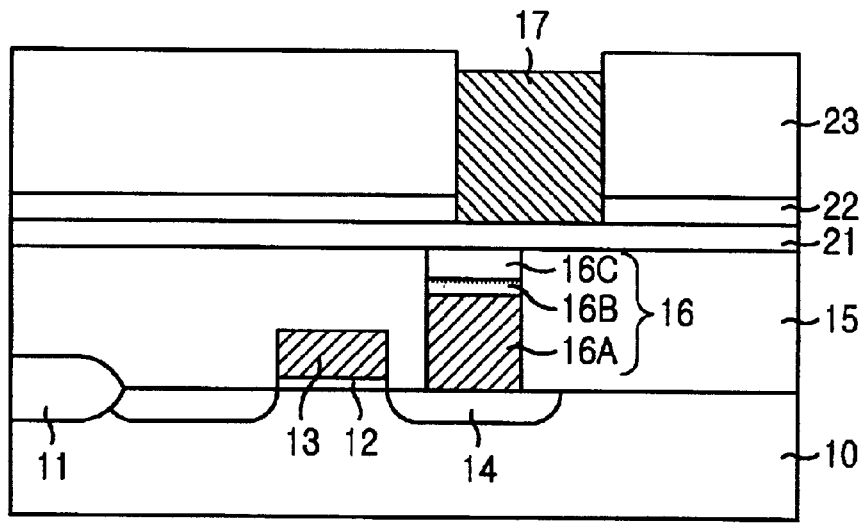
Figure 2D:
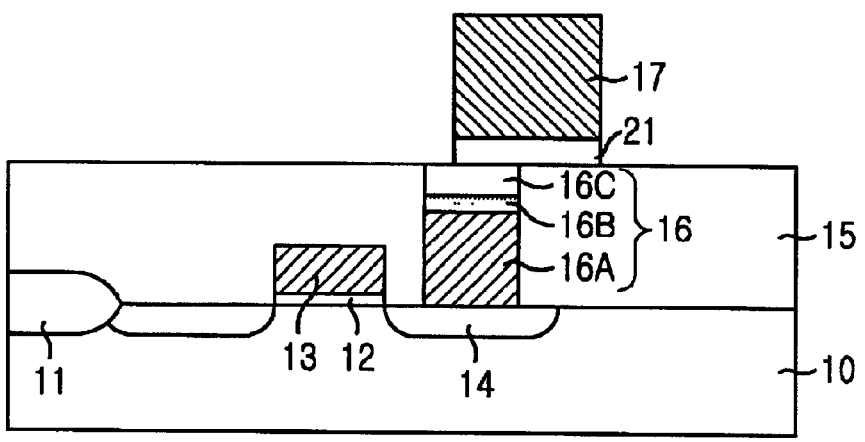
Figure 2E:
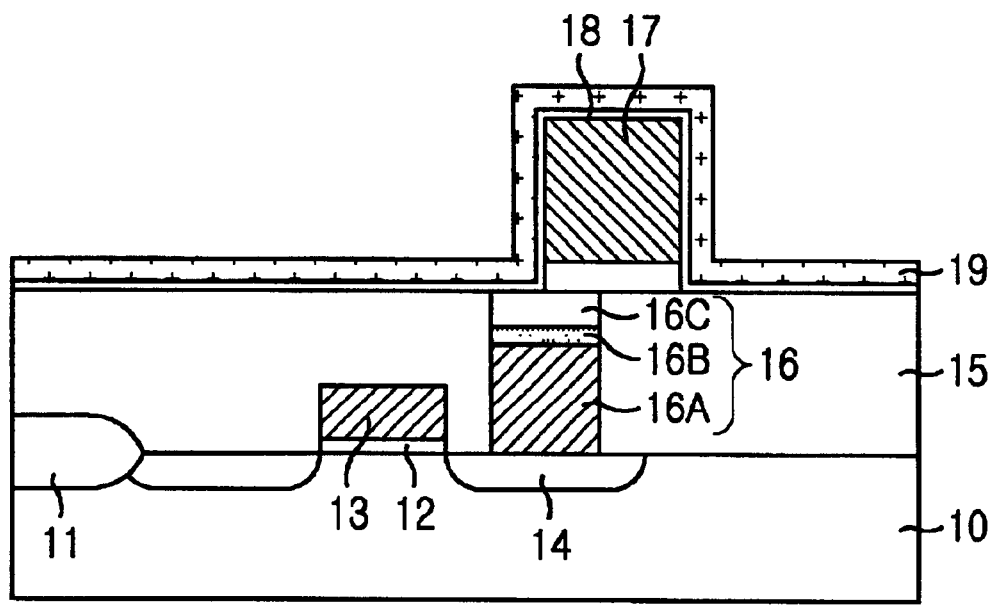
Figure 3A:
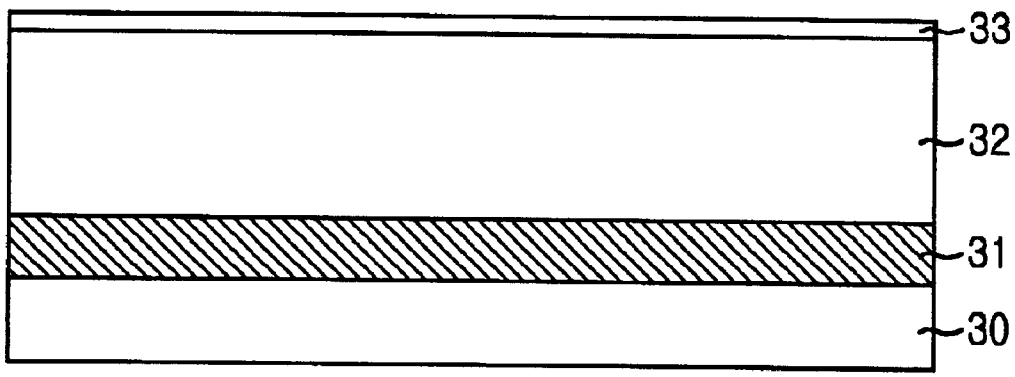

As shown in FIG. 3A, a conducting layer 31 is formed over a semiconductor substrate 30, on which a determined lower structure (not shown), comprising an isolation layer, such as a field oxide layer, a transistor including a gate insulating layer, a gate electrode and the source/drain junctions. Thereafter, an interlayer insulating layer, composed of a first insulating layer 32 and a second insulting layer 33, is formed on the conducting layer 31.

The conducting layer 31 is used as an electrode for forming a lower electrode of a capacitor, by using an electro plating technique. In the preferred embodiment of the present invention, a doped polysilicon layer is deposited and a thermal treatment process is performed to activate impurities in the doped polysilicon layer, whereby the conducting layer 31 is formed.

The process for forming the conducting layer 31 may be omitted, in this case, the semiconductor substrate 30 may be used as the electrode for forming a lower electrode of a capacitor. The second insulating layer 33, playing as an antireflection layer, is formed with a material of which etching selectivity is higher than the first insulating layer 32. In a preferred embodiment of the present invention, the first insulating layer 32 is formed by depositing a silicon oxide layer to a thickness of 3000–8000 Å, and the second insulating layer 33 is formed by depositing a silicon nitride layer to a thickness of 300 to 1000 Å.

Figure 3B:
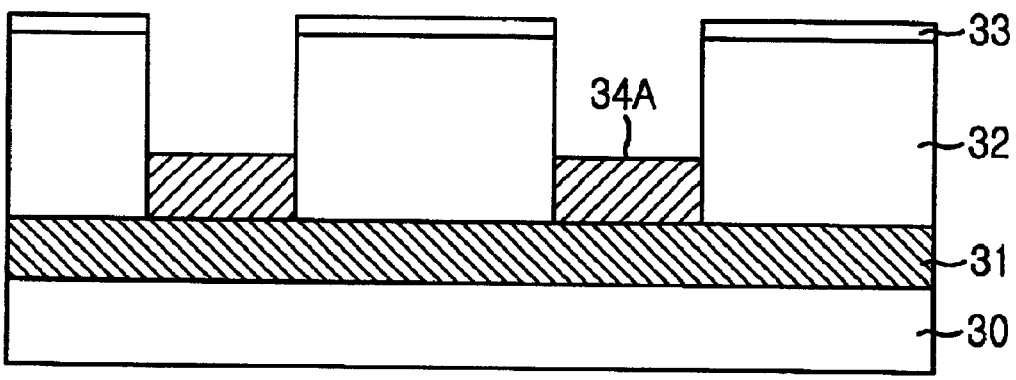

As shown in FIG. 3B, the second insulating layer 33 and the first insulating layer 32 are etched to form a contact hole exposing the conducting layer 31. One of the source/drain junction (not shown) formed in the semiconductor substrate 30 may be exposed by the contact hole, if the conducting layer 31 is not formed.

And then, a polysilicon layer 34A, for forming a plug is deposited to a thickness of 500–3000 Å on the second insulating layer 33 and in the contact hole. Thereafter, an etching process is performed to expose the surface of the second insulting layer 33 and to remove a part of the polysilicon layer 34A in the contact hole. Thereby, the height difference between the surface of the second insulating layer 33 and the surface of the polysilicon layer 34A becomes 500 to 1500 Å.

Figure 3C:
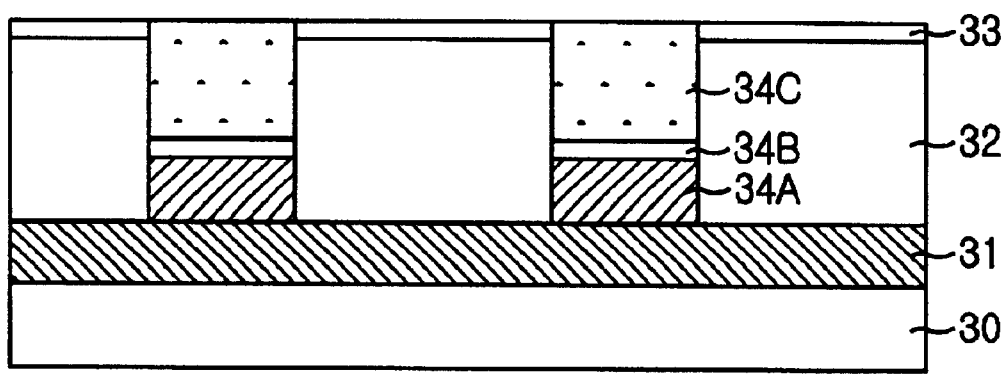

As sown in FIG. 3C, an ohmic contact layer 34B and a diffusion barrier layer 34C are formed, one by one, on the polysilicon layer 34A. Subsequently, a chemical mechanical polishing (hereafter, abbreviated CMP) process is performed until the surface of the second insulating layer 33 is exposed. In a preferred embodiment of the present invention, the ohmic contact layer 34B is formed with $TiSi_x$ and the diffusion barrier layer 34C is formed with TiN, TiSiN, TiAlN, TaSiN, TaAlN, $IrO_2$ or $RuO_2$. For forming the $TiSi_x$, a Ti layer is deposited, an annealing process is performed for reaction between Ti atom in the titanium layer and Si atom in the polysilicon layer 34A, and a wet etching process is performed to remove the Ti layer remaining on the second insulating layer 33 and the $TiSi_x$ layer.

Figure 3D:
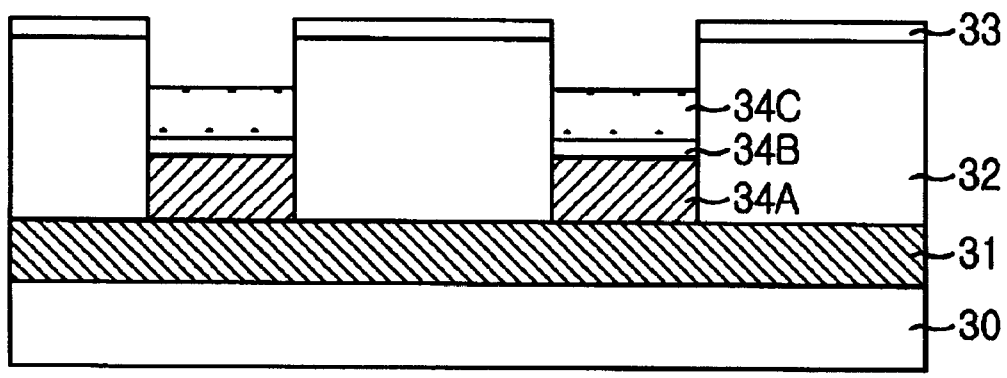

As shown in FIG. 3D, a part of the diffusion barrier layer 34C is etched using an etchant, such as a mixed gas comprising $Cl_2$ and $BCl_3$, to which the diffusion barrier layer 34C has higher etching selectivity than the second insulting layer 33.

Figure 3E:
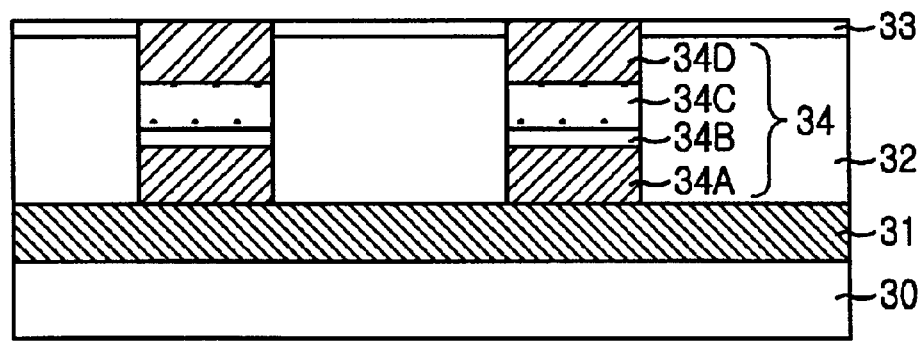

As shown in FIG. 3E, a seed layer 34D is deposited on the second insulating layer 33 and the diffusion barrier layer 34C, and a blanket etching process or a CMP process is performed until the second insulating layer 33 is exposed. Thereby, the plug 34 composed of polysilicon layer 34A, the ohmic contact layer 34B, the diffusion barrier 34C and the seed layer 34D, is completely formed. In the preferred embodiment of the present invention, Ru, Ir, Pt, SrO, W, Mo, Co, Ni, Au or Ag is deposited by using chemical vapor deposition technique, for forming the seed layer 34D.

Also, the process for forming the polysilicon layer 34A may be omitted, in such case, the plug 34 is composed of the ohmic contact layer 34B layer, the diffusion barrier layer 34C and the seed layer 34D. Moreover, the process for forming the ohmic contact layer 34B may be omitted, in such a case, the plug 34 is composed of the polysilicon layer 34A, diffusion barrier layer 34C and the conducting layer 34D. Accordingly, it is possible that the plug 34 is composed of the diffusion barrier layer 34C and the conducting layer 34D.

Figure 3F:
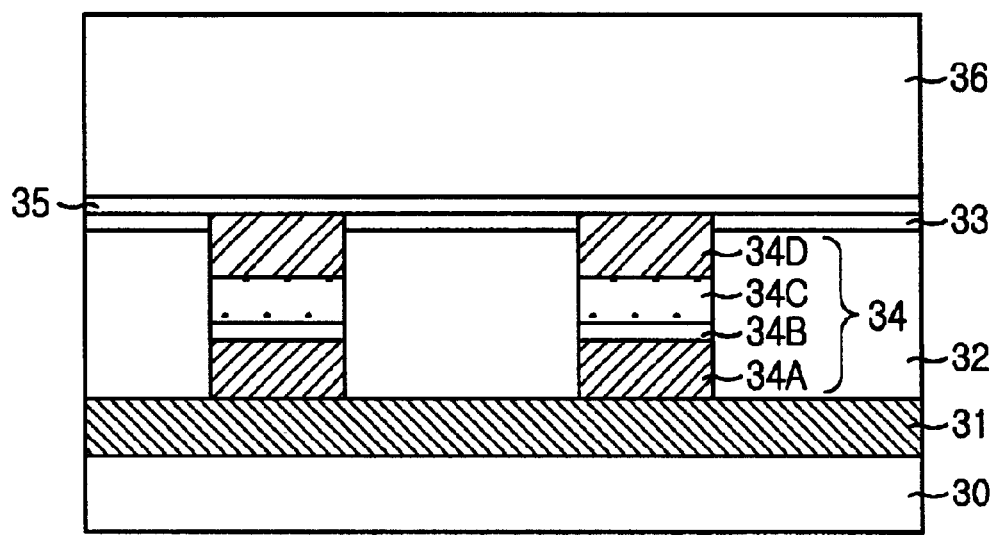

As shown in FIG. 3F, a glue layer 35 is formed on the seed layer 34D and the second insulating layer 33, thereafter a sacrificial layer 36 is formed on the glue layer 35. In the preferred embodiment of the present invention, the glue layer 35 is formed with TiN, TiAlN, TaN, TaSiN, $Al_2O_3$ or $TiO_2$ 50–500 Å thick, and the sacrificial layer 36 is formed with silicon oxide 5000–15000 Å thick.

Figure 3G:
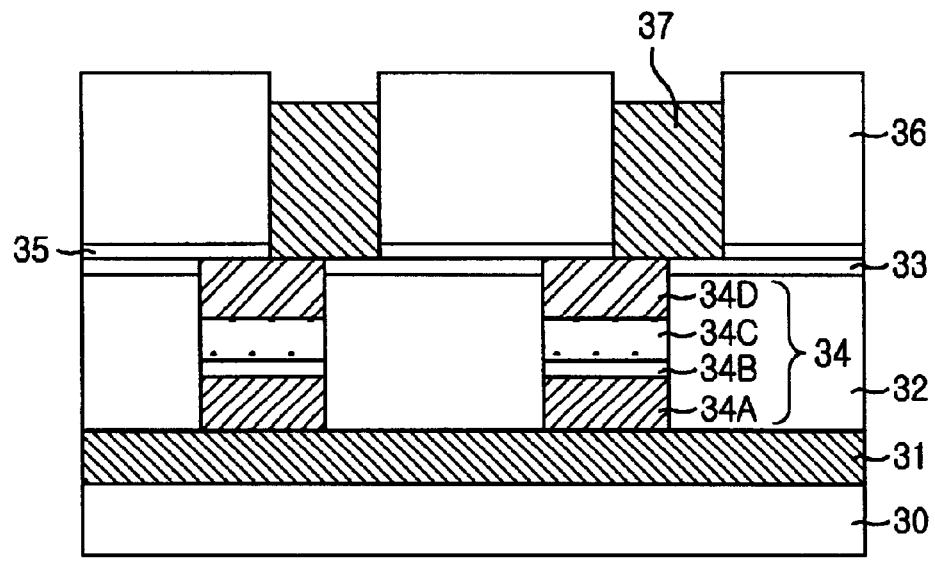

As shown in FIG. 3G, the sacrificial layer 36 and the glue layer 35 is selectively etched to form opening exposing the seed layer 34D, and a lower electrode 37 is formed on the seed layer 34D in the opening. In the preferred embodiment of the present invention, a Pt layer as the lower electrode 37, is deposited to a thickness of 4000–12000 Å by the electroplating. A current density of 0.1–20 mA/cm$^2$ is imposed on the conducting layer 31, with DC or DC pulse. On the other hand, the semiconductor substrate 30 may be used as an electrode during the electro plating in case the conducting layer 31 is not formed.

Figure 3H:
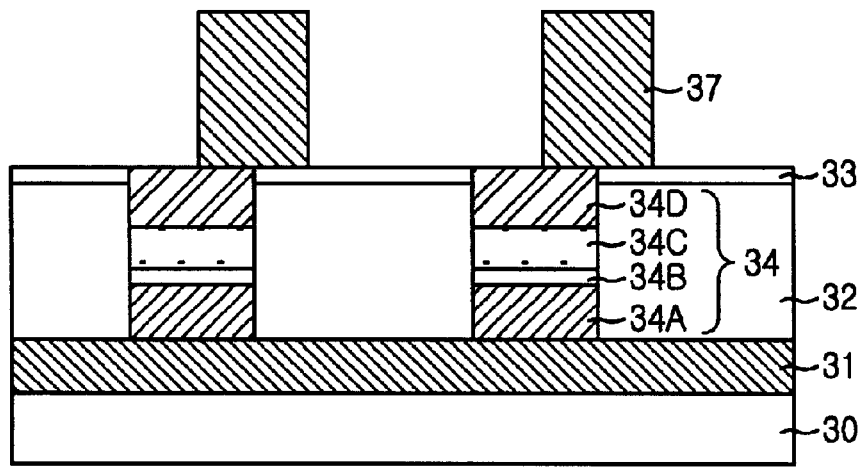
Figure 31:
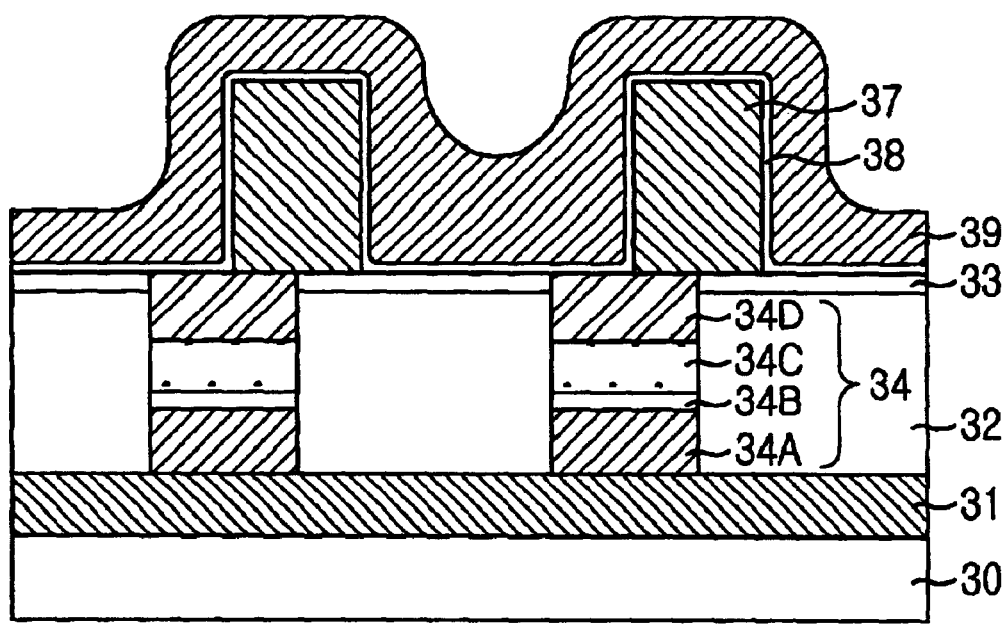

As shown FIG. 3H, the sacrificial layer 36 and the glue layer 35 are removed by a wet etching using an HF solution or BOE solution. Also, the glue layer 35 may be removed by a dry etching.

According to the preceding process of the present invention, the diffusion barrier layer 34C of the plug 34 is not exposed, even if the mask misalignment is occurred in the process for forming the opening. That is, the seed layer 34D, covering the diffusion layer 34C, is exposed in case of occurring the mask misalignment.

As shown in FIG. 3I, a dielectric layer 38 is deposited on the lower electrode 37 and the second insulating layer 33. Thereafter, an upper electrode 39 is formed on the dielectric layer 38. In the preferred embodiment of the present invention, a BST layer is deposited to a thickness of 150–500 Å at a temperature of 350–600° C. for forming the dielectric layer 38, and an annealing for crystallizing the dielectric layer 38 is performed in an $N_2$ gas atmosphere at a temperature of 500–700° C. for 30–180 seconds, thereby dielectric characteristic of the dielectric layer 28 may be improved. The upper electrode 39 is formed with a material, such as Pt, Ru, Ir or SrO.

There are several advantages to form the conducing layer on the diffusion barrier. A first advantage is that it is possible to prevent the dielectric layer being contacted with the diffusion barrier. A second advantage is that it is possible to reduce the leakage current. A third advantage is that it is possible to prevent the diffusion barrier from being exposed even if the mask misalign is occurred, thereby the annealing for crystallizing the dielectric layer may be performed at a high temperature. A fourth advantage is that it is possible to obtain high capacitance of the capacitor in the highly integrated semiconductor device.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A semiconductor memory device, comprising:
   a semiconductor substrate, a gate electrode formed on the semiconductor substrate, and a plurality of source/drain junctions formed in the semiconductor substrate;
   an interlayer insulating layer formed over the semiconductor substrate, the interlayer insulating layer having a contact hole exposing a portion of source/drain junctions;
   a plug formed in the contact hole, wherein the plug including a diffusion barrier layer is recessed in the contact hole;
   a seed layer for electro plating by filling a remaining portion of the contact hole; and
   a lower electrode of a capacitor contacted to the seed layer, wherein the lower electrode is formed by using an electro plating technique;
   a dielectric layer formed on the lower electrode; and
   an upper electrode formed on the dielectric layer.

2. The semiconductor device as recited in claim 1, wherein the seed layer is selected from a group consisting of Ru layer, Ir layer, Pt layer, SrO layer, W layer, Mo layer, Co layer, Ni layer, Au layer and Ag layer.

3. The semiconductor device as recited in claim 1, wherein the diffusion barrier layer is selected from a group consisting of TIN layer, TiSiN layer, TiAlN layer, TaSiN layer, TaAlN layer, $IrO_2$ layer and $RuO_2$ layer.

4. The semiconductor device as recited in claim 1, further comprising a polysilicon layer between the diffusion barrier layer and the semiconductor substrate.

5. The semiconductor device as recited in claim 1, further comprising an ohmic contact layer between the diffusion barrier layer and the semiconductor substrate.

6. The semiconductor device as recited in claim 5, further comprising a polysilicon layer between the ohmic contact layer and the semiconductor substrate.

7. A method for fabricating a semiconductor memory device, comprising the steps of:
   providing a semiconductor substrate, forming a gate electrode on the semiconductor substrate, and forming a plurality of source/drain junctions in the semiconductor substrate;
   forming an interlayer insulating layer over the semiconductor substrate;
   etching the interlayer insulating layer and forming contact hole;
   forming a plug recessed in the contact hole, wherein the plug includes a diffusion barrier layer;
   forming a seed layer for electro plating on the diffusion barrier layer to fill a remaining portion of the contact hole;
   forming a lower electrode of a capacitor contacted to the seed layer by using an electro plating technique;
   forming a dielectric layer of the capacitor on the lower electrode; and
   forming an upper electrode of the capacitor on the dielectric layer.

8. The method as recited in claim 7, wherein the seed layer is formed with Ru, Ir, Pt, SrO, W, Mo, Co, Ni, Au or Ag.

9. The method as recited in claim 8, the step of providing the semiconductor substrate comprising:

forming a conducting layer on the semiconductor substrate, wherein the conducting layer is electrically connected to the lower electrode via the plug.

10. The method as recited in claim 8, wherein the diffusion barrier layer is formed with TiN, TiSIN, TiAlN, TaSiN, TaAlN, $IrO_2$ or $RuO_2$.

11. The method as recited in claim 8, wherein the dielectric layer is formed with $BaSrTiO_3$ layer, and wherein the upper electrode is formed with Pt layer, Ru layer or Ir layer.

12. A method for fabricating a semiconductor memory device, comprising the steps of:

providing a semiconductor substrate, forming a gate electrode on the semiconductor substrate, and forming a plurality of source/drain junctions in the semiconductor substrate;

forming an interlayer insulating layer over the semiconductor substrate;

etching the interlayer insulating layer and forming a contact hole;

forming a plug in the contact hole, wherein the plug includes a diffusion barrier layer;

forming a seed layer for electro plating on the diffusion barrier layer to fill a remaining portion of the contact hole;

forming a glue layer on the seed layer and the interlayer insulating layer;

forming a sacrificial layer on glue layer;

etching the sacrificial layer and the glue layer and forming an opening defining a region of a lower electrode of a capacitor;

forming the lower electrode on the seed layer in the opening, by using an electro plating technique;

removing the sacrificial layer and the glue layer;

forming a dielectric layer of the capacitor on the lower electrode; and forming an upper electrode of the capacitor on the dielectric layer.

13. The method as recited in claim 12, the step of forming the plug including:

forming the diffusion barrier layer in the contact hole;

etching the diffusion barrier to remove a part of the diffusion barrier layer in the contact hole; and forming the seed layer on the diffusion barrier layer.

14. The method as recited in claim 13, the step of providing the semiconductor substrate including:

forming a conducting layer on the semiconductor substrate, wherein the conducting layer is used as an electrode in the step of forming the lower electrode.

15. The method as recited in claim 13, wherein the seed layer is formed with Ru, Ir, Pt, SrO, W, Mo, Co, Ni, Au or Ag, and wherein the diffusion barrier layer is formed with TiN, TiSiN, TiAlN, TaSiN, TaAlN, $IrO_2$ or $RuO_2$.

16. The method as recited in claim 15, wherein a silicon oxide layer and a nitride layer are staked to form the interlayer insulating layer.

17. The method as recited in claim 16, wherein the diffusion barrier layer is etched with a mixed gas comprising $Cl_2$ and $BCl_3$.

18. The method as recited in claim 16, the dielectric layer is formed with a $BaSrTiO_3$ layer, and wherein the upper electrode is formed with Pt layer, Ru layer or Ir layer.

* * * * *